United States Patent [19]

Kitahata

[11] Patent Number: 6,080,631
[45] Date of Patent: Jun. 27, 2000

[54] METHOD FOR MANUFACTURING SELF-ALIGNMENT TYPE BIPOLAR TRANSISTOR HAVING EPITAXIAL BASE LAYER

[75] Inventor: Hideki Kitahata, Tokyo, Japan

[73] Assignee: NEC Corporation, Tokyo, Japan

[21] Appl. No.: 09/083,225

[22] Filed: May 22, 1998

[30] Foreign Application Priority Data

May 23, 1997 [JP] Japan ................................. 9-150301

[51] Int. Cl.$^7$ ................................................ H01L 21/331
[52] U.S. Cl. ........................................ 438/341; 438/357
[58] Field of Search ................................. 438/357, 356, 438/360, 341, 369; 257/587, 592

[56] References Cited

U.S. PATENT DOCUMENTS

| | | | |
|---|---|---|---|
| 5,420,454 | 5/1995 | Vook et al. | 257/592 |
| 5,877,540 | 3/1999 | Naruse et al. | 257/587 |

FOREIGN PATENT DOCUMENTS

| | | |
|---|---|---|
| 2-1936 | 1/1990 | Japan . |
| 2-291136 | 11/1990 | Japan . |
| 4-56328 | 2/1992 | Japan . |
| 5-206151 | 8/1993 | Japan . |
| 5-235017 | 9/1993 | Japan . |
| 5-243244 | 9/1993 | Japan . |
| 6-120235 | 4/1994 | Japan . |
| 7-86293 | 3/1995 | Japan . |
| 7-183310 | 6/1995 | Japan . |

*Primary Examiner*—Charles Bowers
*Assistant Examiner*—Craig Thompson
*Attorney, Agent, or Firm*—Sughrue, Mion, Zinn, Macpeak & Seas, PLLC

[57] ABSTRACT

In a method for manufacturing a bipolar transistor, a semiconductor layer having a collector region of a first conductivity type is formed, and an epitaxial semiconductor layer of a second conductivity type is grown on the semiconductor layer. Then, impurities are thermally diffused from the epitaxial semiconductor layer into the semiconductor layer. Thus, a base region is formed by the epitaxial semiconductor layer and a part of the semiconductor layer.

12 Claims, 18 Drawing Sheets

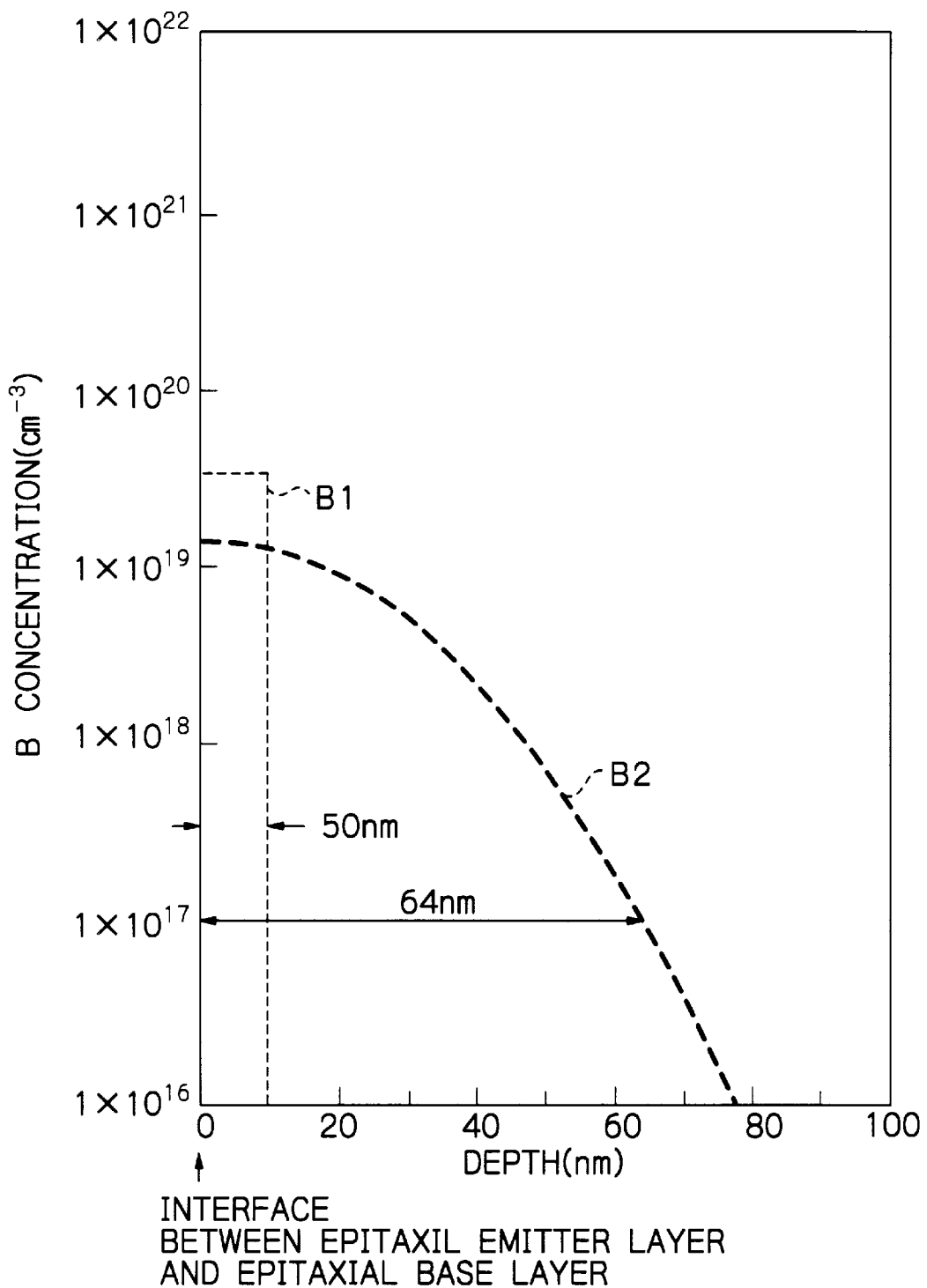

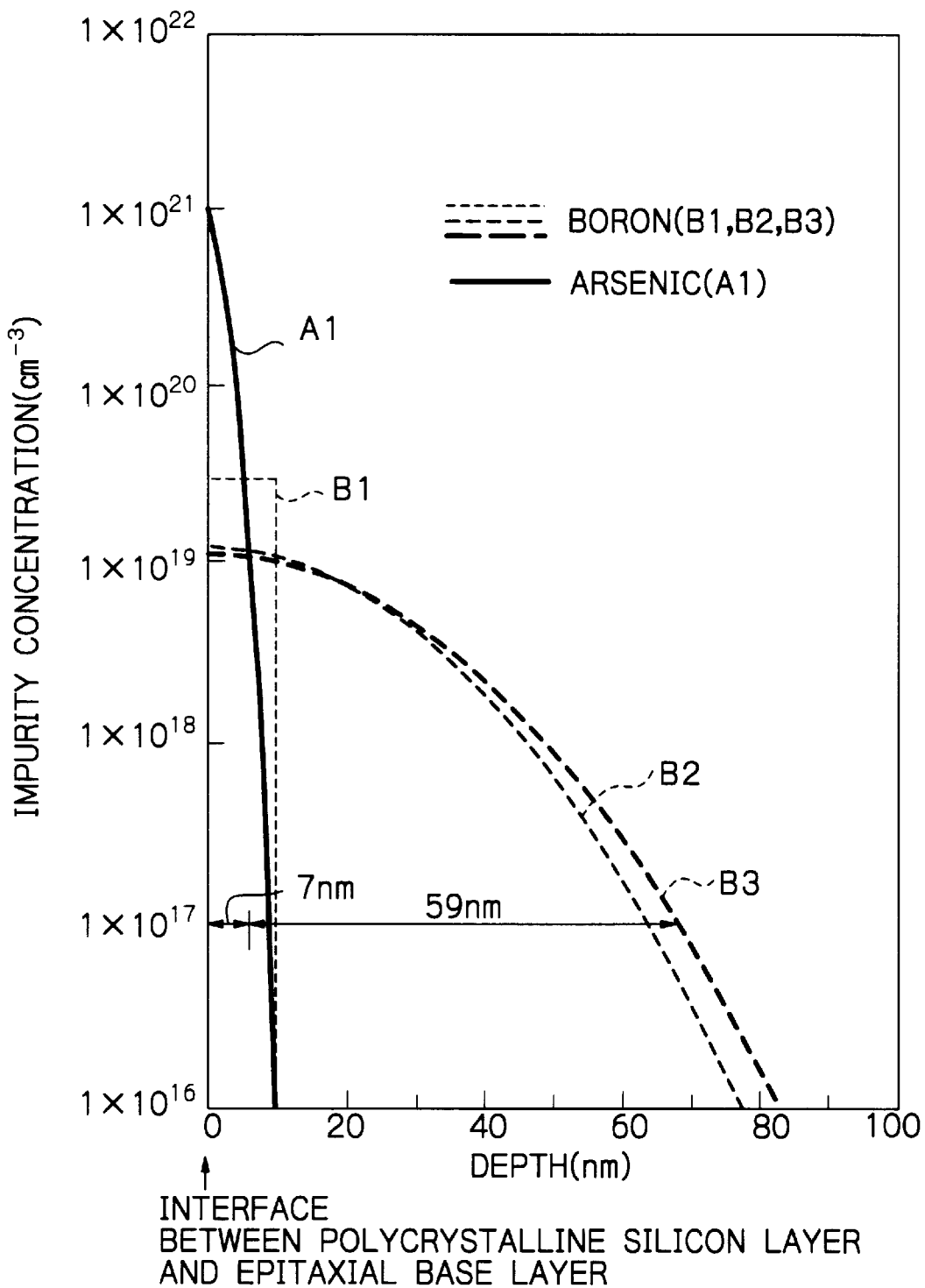

METHOD FOR MANUFACTURING SELF-ALIGNMENT TYPE BIPOLAR TRANSISTOR HAVING EPITAXIAL BASE LAYER

BACKGROUND OF THE INVENTION

1. Field of the Invention

The present invention relates to a method for manufacturing a self-alignment type bipolar transistor having an epitaxial base layer.

2. Description of the Related Art

Generally, in a bipolar transistor, the thinner a base layer, the larger the operation speed of the bipolar transistor. That is, when the base layer is thinner, the carrier transit distance is decreased to increase the operation speed.

A first approach is to implant impurity ions via a thin silicon oxide layer into a base forming region of a semiconductor substrate at a low acceleration energy. Then, the impurity ions are thermally diffused into the base forming region. In this case, however, it is difficult to make a shallower base region due to the channelling phenomenon.

A second approach is to form a boron-silicated glass (BSG) layer on a base forming region of a semiconductor substrate and thermally inject boron ions into the base forming region. In this case, however, since the degree of diffusion within the BSG layer is different from that within the semiconductor substrate, it is difficult to obtain a stable impurity profile within the base forming region.

A third approach is to grow an epitaxial base layer including impurities on a semiconductor substrate. In this case, an impurity profile within the epitaxial base layer can be precisely determined by programming an epitaxial process, so that the epitaxial base layer, i.e., the base region can be thin.

On the other hand, in view of the reduction of a parasitic capacitance and a parasitic resistance of a bipolar transistor, a self-alignment bipolar transistor has been developed to increase the operation speed.

A first prior art method for manufacturing a self-alignment type bipolar transistor having an epitaxial base layer is disclosed in JP-A-4-56328. That is, after a polycrystalline silicon layer as a base contact (electrode take-out) is formed at the periphery of a base forming region of a semiconductor substrate, an epitaxial growth process is carried out, so that an epitaxial base layer is grown from the semiconductor substrate and a polycrystalline silicon layer is grown from the above-mentioned polycrystalline silicon layer. This will be explained later in detail.

In the first prior art method as illustrated, however, an emitter-base (PN) junction made of polycrystalline silicon is created, which generates a recombination current.

In addition, since the surface of the semiconductor substrate is damaged by an anisotropic etching process, crystal defects are created in the semiconductor substrate. As a result, crystal defects are induced in the epitaxial base layer, which easily create a recombination current.

A second prior art method for manufacturing a self-alignment type bipolar transistor having an epitaxial base layer is disclosed in JP-A-7-183310. That is, after a polycrystalline silicon layer as a base contact (electrode take-out) is formed on a silicon oxide layer at the periphery of a base forming region of a semiconductor substrate, an epitaxial growth process is carried out, so that an epitaxial base layer is grown from the semiconductor substrate and a polycrystalline silicon layer is grown from the bottom of the above-mentioned polycrystalline silicon layer. Then, the grown polycrystalline silicon layer is covered by a sidewall BSG layer. This will be explained later in detail.

In the second prior art method, however, since the BSG layer is formed by a chemical vapor deposition (CVD) process, the surface of the epitaxial base layer is contaminated a surface level is easily generated in the epitaxial base layer. This creates a recombination current. In addition since the surface of the epitaxial base layer is damaged by the anisotropic etching process for forming the sidewall BSG layer, crystal defects are created in the epitaxial base layer. As a results crystal defects are also induced in an epitaxial emitter layer. Such crystal defects easily create a recombination current.

Note that the recombination current decreases the current gain of the bipolar transistor.

SUMMARY OF THE INVENTION

It is an object of the present invention to provide a method for manufacturing a bipolar transistor capable of reducing a recombination current.

According to the present invention, in a method for manufacturing a bipolar transistor, a semiconductor layer having a collector region of a first conductivity type is formed, and an epitaxial semiconductor layer of a second conductivity type is grown on the semiconductor layer. Then, impurities are thermally diffused from the epitaxial semiconductor layer into the semiconductor layer. Thus, a base region is formed by the epitaxial semiconductor layer and a part of the semiconductor layer.

BRIEF DESCRIPTION OF THE DRAWINGS

The present invention wil be more clearly understood from the description as set forth below, as compared with the prior art, with reference to the accompanying drawings, wherein:

FIG. 5 is an impurity concentration diagram of the bipolar transistor manufactured by the method as illustrated in FIGS. 4A through 4J;

FIG. 7 is an impurity concentration diagram of the bipolar transistor manufactured by the method as illustrated in FIGS. 4A through 4H, 6A and 6B;

DESCRIPTION OF THE PREFERRED EMBODIMENTS

Before the description of the preferred embodiments, prior art methods for manufacturing a bipolar transistor will be explained with reference to FIGS. 1A through 1H and 2A through 2G.

FIGS. 1A through 1H are cross-sectional views for explaining a first prior art method for manufacturing a bipolar transistor (see JP-A-4-56328).

Figure 1A:
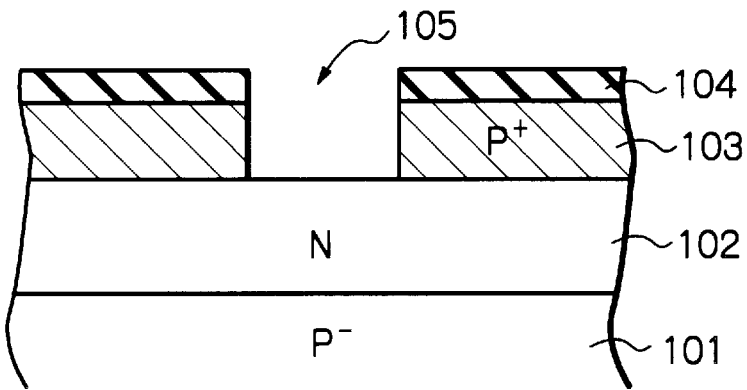
FIGS. 1A through 1H are cross-sectional views for explaining a first prior art method for manufacturing a bipolar transistor.

First, referring to FIG. 1A, arsenic ions are implanted into a P⁻-type monocrystalline silicon substrate 101 to form an N-type collector layer 102. Then, a P⁺-type polycrystalline silicon layer 103 is deposited on the collector layer 102, and a silicon nitride layer 104 is deposited on the polycrystalline silicon layer 103. Then, an opening 105 is perforated in the silicon nitride layer 104 and the polycrystalline silicon layer 103.

Figure 1B:
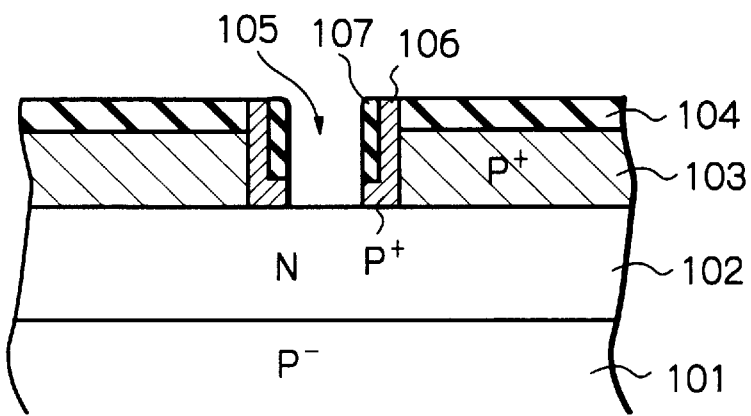

Next, referring to FIG. 1B, a P⁺-type polycrystalline silicon layer and a silicon nitride layer are sequentially deposited on the entire surface. Then, the silicon nitride layer and the polycrystalline silicon layer are etched back by an anisotropic etching process. As a result, a P⁺-type sidewall polycrystalline silicon layer 106 and a sidewall silicon nitride layer 107 are formed on the sidewall of the polycrystalline silicon layer 103 and the silicon nitride layer 104 within the opening 105.

Figure 1C:
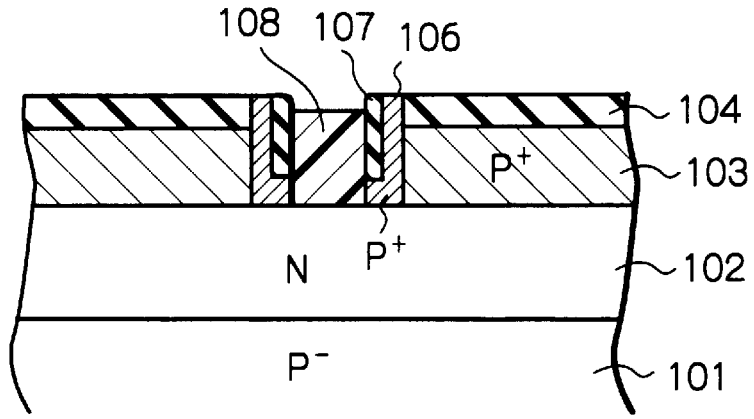

Next, referring to FIG. 1C, a photoresist pattern 108 is formed only within the opening 105.

Figure 1D:
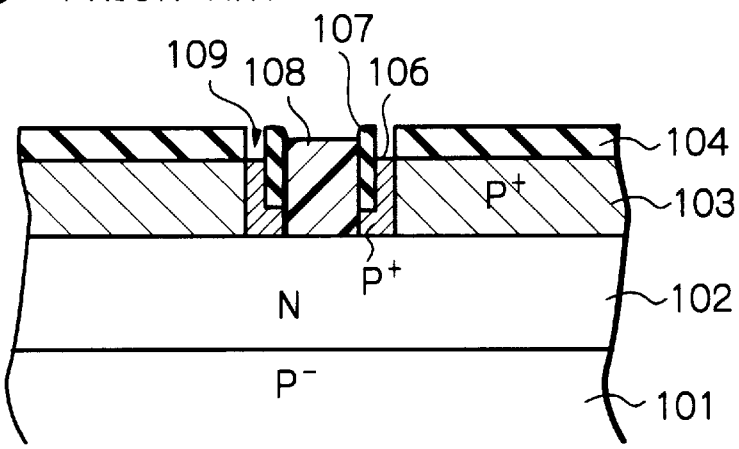

Next, referring to FIG. 1D, the sidewall polycrystalline silicon layer 106 is etched by using the photoresist pattern 108 and the silicon nitride layer 104 and 107 14 a mask. As a result, an opening 109 is created between the silicon nitride layers 104 and 107. Then, the photoresist pattern 108 is removed.

Figure 1E:
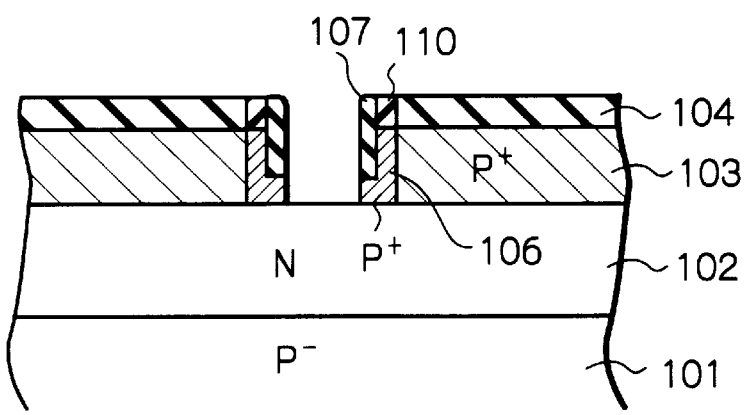

Next, referring to FIG. 1E, a silicon oxide layer 110 is deposited on the entire surface. Then, the silicon oxide layer is etched back, so that the silicon oxide layer 110 is left only within the opening 109.

Figure 1F:
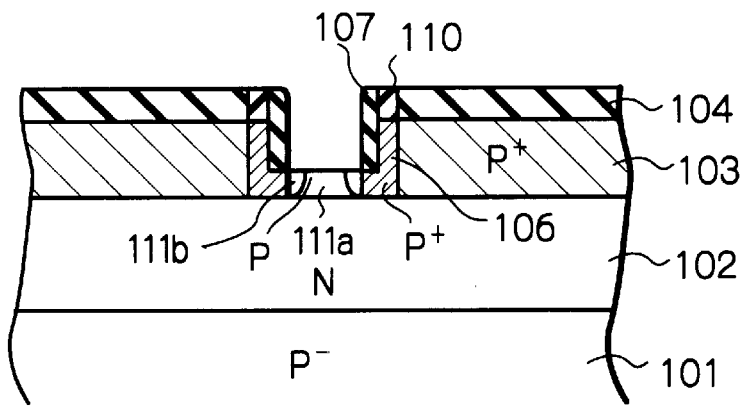

Next, referring to FIG. 1F, an epitaxial growth is carried out. As a result, a P-type moncrystalline silicon epitaxial base layer 111a is formed on the collector layer 102. Simultaneously, a P-type polycrystalline silicon layer 111b is formed on the sidewall of the polycrystalline silicon layer 106.

Figure 1G:
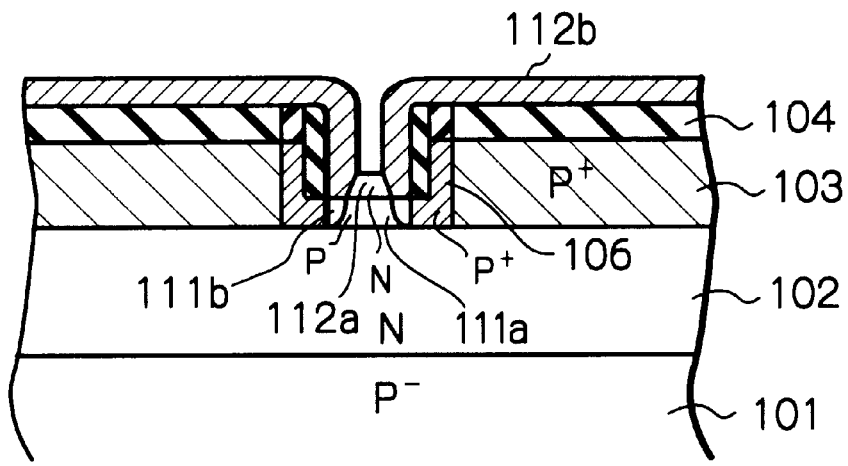

Next, referring to FIG. 1G, an epitaxial growth is carried out. As a result, an N-type monocrystalline silicon epitaxial emitter layer 112a is formed on the epitaxial base layer 111a. Simultaneously, an N-type polycrystalline silicon layer 112b is formed on the polycrystalline silicon layer 111b, the silicon nitride layers 104 and 107, and the silicon oxide layer 110.

Figure 1H:
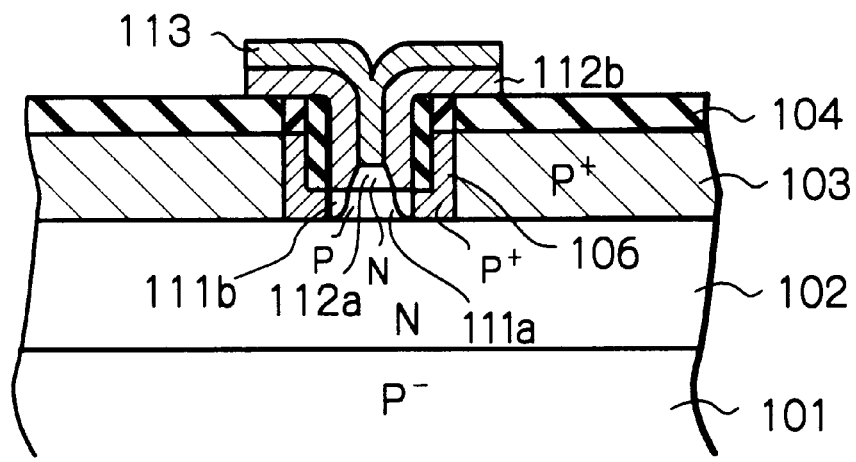

Finally, referring to FIG. 1H, a metal layer made of aluminum is deposited on the entire surface. Then, the metal layer is patterned to form an emitter electrode 113.

Note that the polycrystalline silicon layers 103 and 106 serve as a P⁺-type base contact layer which is connected to a base electrode (not shown). Also, the collector layer is connected to a collector electrode (not shown). The base electrode and the collector electrode are formed simultaneously with the formation of the emitter electrode 113.

In the manufacturing method as illustrated is FIGS. 1A through 1H, the emitter region (112a, 112b) is completely separated from the P⁺-type bas contact layers 103 and 106 by the silicon nitride layers 104 and 107 and the silicon oxide layer 110.

In the method as illustrated in FIGS. 1A through 1H, however, the P-type polycrystalline silicon layer 111b is in direct contact with the N-type polycrystalline silicon layer 112b, so that an emitter-base (PN) junction made of polycrystalline silicon is formed by the polycrystalline silicon layers 111b and 112b. Such a PN junction easily generates a recombination current.

In addition, since the surface of the collector layer 102 is damaged by the anisotropic etching process for forming the sidewall silicon nitride layer 107 and the sidewall polycrystalline silicon layer 106, crystal defects are created in the collector layer 102. As a result, crystal defects are induced in the epitaxial base layer 111a and the epitaxial emitter layer 112a. Such crystal defects easily create a recombination current.

The above-described recombination currents decrease the current gain of the bipolar transistor.

FIGS. 2A through 2G are cross-sectional views for explaining a second prior art method for manufacturing a bipolar transistor (see JP-A-7-183310).

Figure 2A:
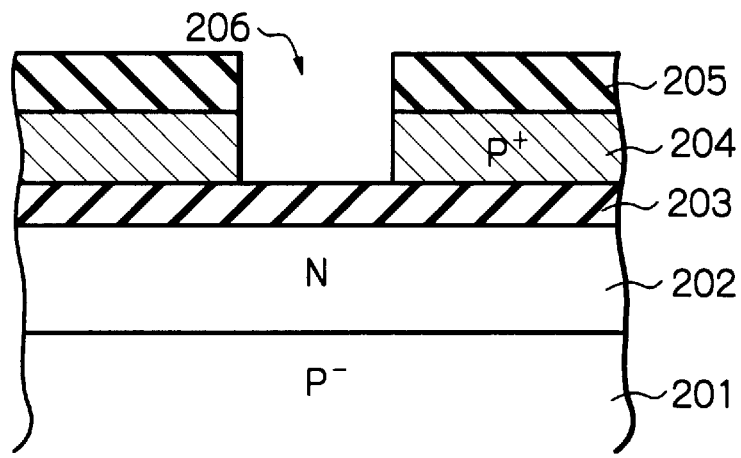
FIGS. 2A through 2G are cross-sectional views for explaining a second prior art method for manufacturing a bipolar transistor.

First, referring to FIG. 2A, arsenic ions are implanted into a P⁻-type moncrystalline silicon substrate 201 to form an N-type collector layer 202. Then, an oxidation process is carried out to form a silicon oxide layer 203 on the collector layer 202. Then, a P⁺-type polycrystalline silicon layer 204 is deposited on the silicon oxide layer 203, and a silicon nitride layer 205 is deposited on the polycrystalline silicon layer 204. Then, an opening 206 is perforated in the silicon nitride layer 205 and the polycrystalline silicon layer 204.

Figure 2B:
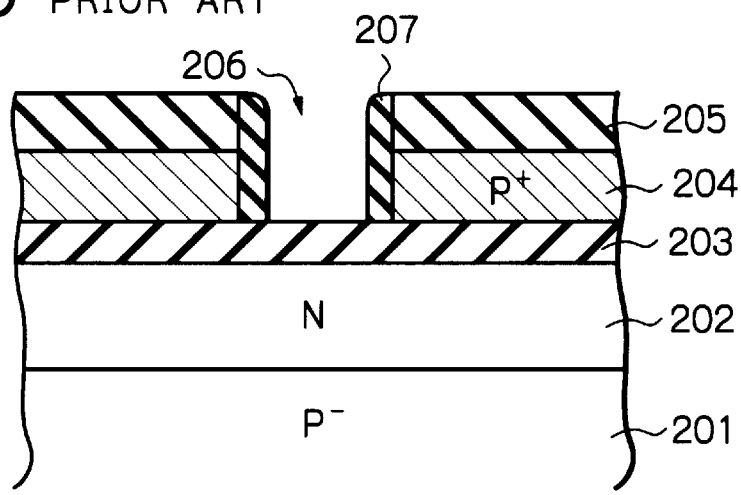

Next, referring to FIG. 2B, a silicon nitride layer is deposited on the entire surface. Then, the silicon nitride layer is etched back by an anisotropic etching process. As a result, a sidewall silicon nitride layer 207 is formed on the sidewall of the polycrystalline silicon layer 204 and the silicon nitride layer 205 within the opening 206.

Figure 2C:
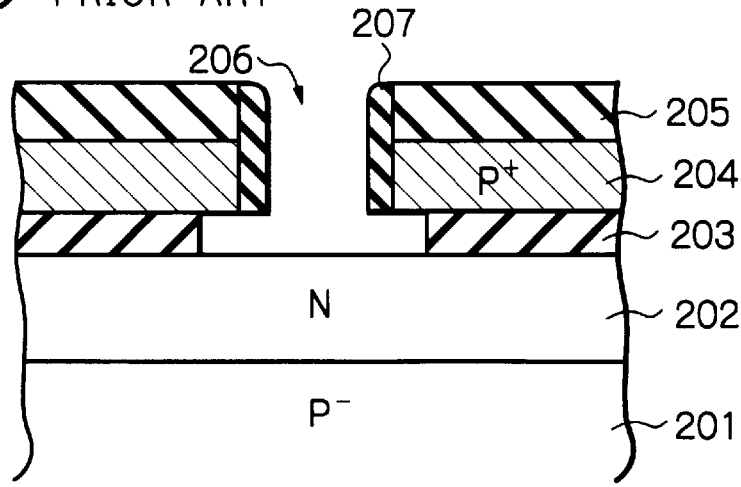

Next, referring to FIG. 2C, the silicon oxide layer 203 is etched by an isotropic etching process using the silicon nitride layers 205 and 207 as a mask. As a result, the bottom surface of the polycrystalline silicon layer 204 is exposed.

Figure 2D:
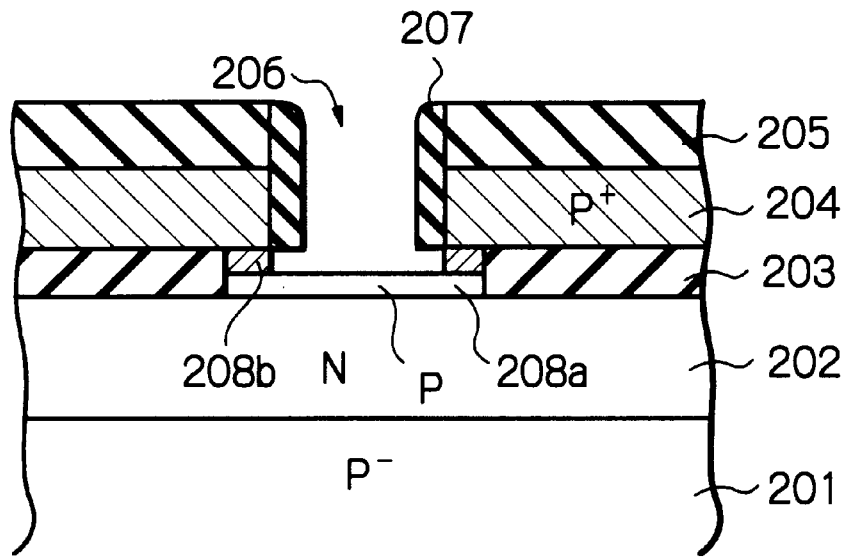

Next, referring to FIG. 2D, an epitaxial growth is carried out. As a result, a P-type moncrystalline silicon epitaxial base layer 208a is formed on the collector layer 202. Simultaneously, a P-type polycrystalline silicon layer 208b is formed under the polycrystalline silicon layer 204.

Note that, since the collector layer 202 was protected by the silicon oxide layer 203, crystal defects are hardly caused by the anisotropic etching processes in the collector layer 202. Therefore, crystal defects are hardly created in the spitaxial base layer 208a grown from the collector layer 202.

Figure 2E:
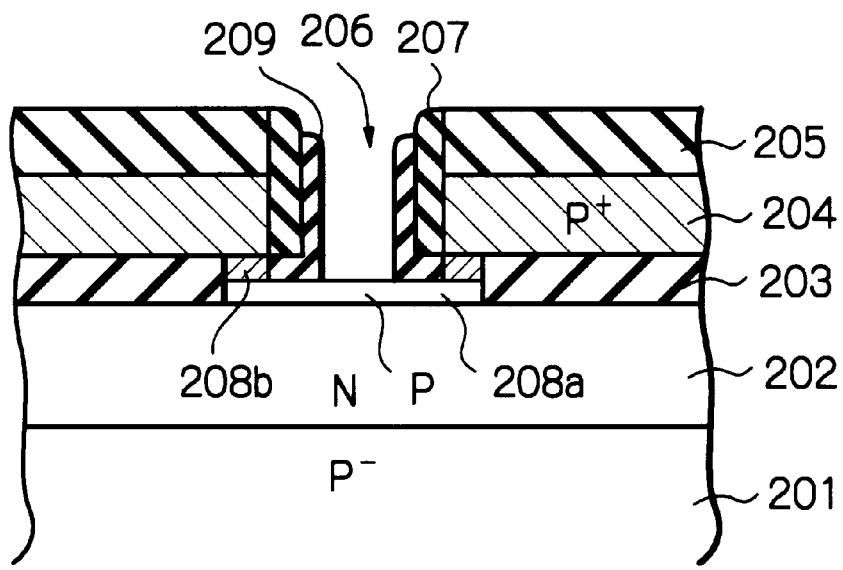

Next, referring to FIG. 2E, a boron-silicated glass (BSG) layer is deposited on the entire surface. Then, the BSG layer is etched by an anisotropic etching process. As a result, a sidewall BSG layer 209 is formed on the sidewall of the sidewall silicon nitride layer 207 and the polycrystalline silicon layer 208b.

Figure 2F:
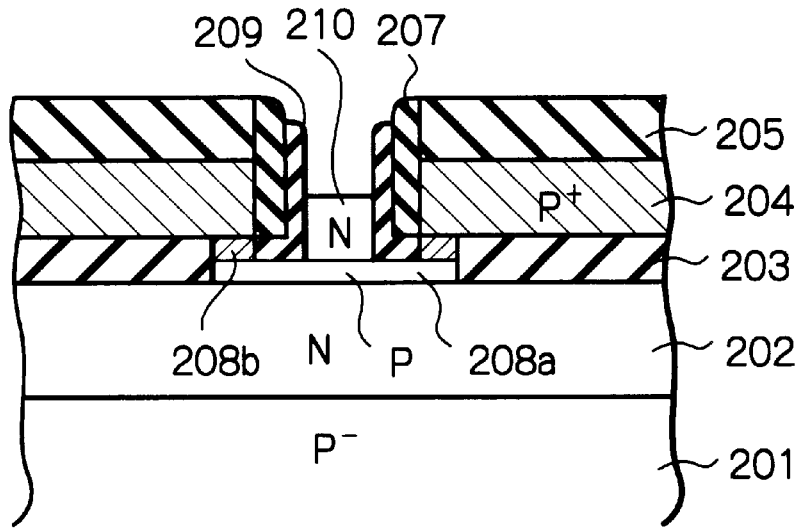

Next, referring to FIG. 2F, an epitaxial growth is carried out. As a result, an N-type monorystalline silicon epitaxial emitter layer 210 is formed on the epitaxial base layer 208a.

Figure 2G:
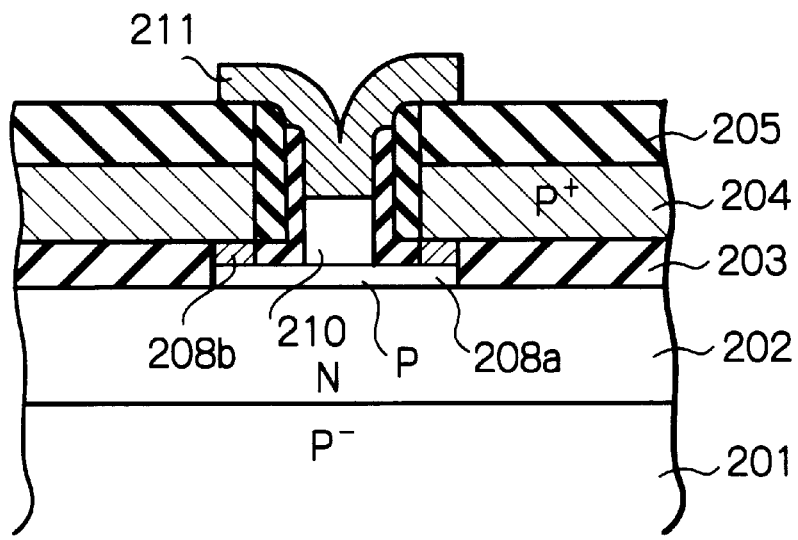

Finally, referring to FIG. 2G, a metal layer made of aluminum is deposited on the entire surface. Then, the metal layer is patterned to form an emitter electrode 211.

Note that the polycrystalline silicon layers 204 and 208b serve as a P⁺-type base contact layer which is connected to a base electrode (not shown). Also, the collector layer is connected to an collector electrode (not shown). The base electrode and the collector electrode are formed simultaneously with the formation of the emitter electrode 211.

In the manufacturing method as illustrated is FIGS. 2A through 2G, the emitter layer 210 is completely separated from the P⁺-type bas contact layers 204 and 208b by the BSG layer 209. Therefore, an emitter-base (PN) junction made of polycrystalline silicon is not formed.

In the method as illustrated in FIGS. 2A through 2G, however, since the BSG layer 209 is formed by a CVD process, the surface of the epitaxial base layer 208a is contaminated, a surface level is easily generated in the epitaxial base layer 208a. This creates a recombination current.

In addition, since the surface of the epitaxial base layer 208a is damaged by the anisotropic etching process for forming the sidewall BSG layer 209, crystal defects are created in the epitaxial base layer 208a. As a result, crystal defects are also induced in the epitaxial emitter layer 210. Such crystal defects easily create a recombination current.

The above-described recombination currents decrease the current gain of the bipolar transistor.

Note that the crystal detects within the epitaxial base layers 111a and 208a and the epitaxial emitter layer 112a and 210 can be removed by carrying out an annealing process. In this case, however, the base region width is increased, thus affecting the characteristics of the bipolar transistor. For example, assume that the epitaxial base layer 111a (208a) has a boron concentration of $4 \times 10^{18} cm^{-3}$ and a thickness of 50 nm as indicated by B1 in FIG. 3, and the collector layer 102 (202) has an arsenic concentration of $1 \times 10^{17} cm^{-3}$, and the emitter region 112a (210) has an arsenic concentration of $1 \times 10^{21} cm^{-3}$. In this case, if an annealing operation by a Ramp heating method at 1000° C. for 10 seconds is carried out after the formation of an emitter region, the base region width is increased to 55 nm (+10 percent) as indicated by B2 and A2 in FIG. 3. Also, if an annealing operation by the Ramp heating method at 1000° C. for 1 minute is carried out before the formation of an emitter region, the base region width is increased to 82 nm (+64 percent) as indicated by B3 in FIG. 3. Also, if an annealing operation by the Ramp heating method at 1000° C. for 1 minute is carried out after the formation of the emitter region, the base region width is increased to 74 nm (+48 percent) as indicated by B3 and A3 in FIG. 3.

Note that the increase of the base region width increases the base transit distance of carriers, which remarkably decreases the operation speed.

FIGS. 4A through 4J are cross-sectional views for explaining a first embodiment of the method for manufacturing a bipolar transistor.

Figure 4A:
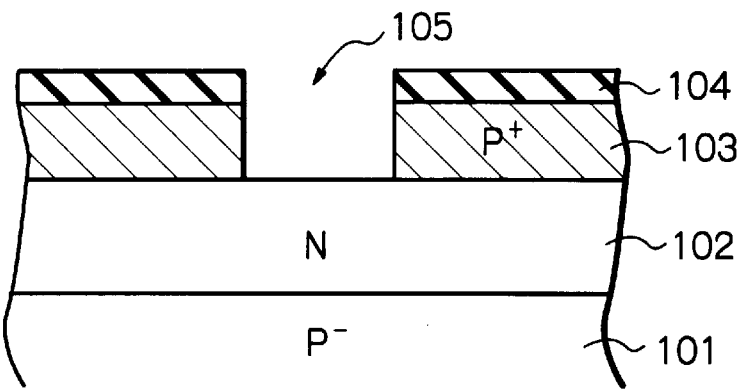
FIGS. 4A through 4J are cross-sectional views for explaining a first embodiment of the method for manufacturing a bipolar transistor according to the present invention.
Figure 4B:
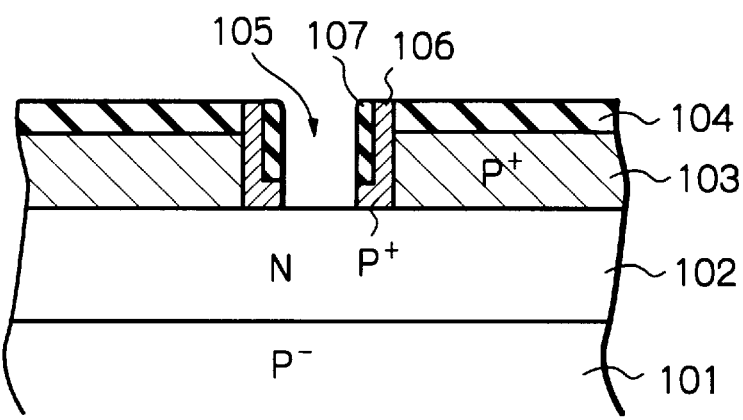

First, referring to FIG. 4A, in the same way as in FIG. 1A, arsenic ions are implanted into a P⁻-type moocrystalline silicon substrate 101 to form an N-type collector layer 102. Then, a P⁺-type polycrystalline silicon layer 103 is deposited on the collector layer 102, and a silicon nitride layer 104 is deposited on the polycrystalline silicon layer 103. Then, an opening 105 is perforated in the silicon nitride layer 104 and the polycrystalline silicon layer 103.

Next, referring to FIG. 4A, in the same way as in FIG. 1B, a P⁺-type polycrystalline silicon layer and a silicon nitride layer are sequentially deposited on the entire surface. Then, the silicon nitride layer and the polycrystalline silicon layer are etched back by an anisotropic etching process. As a result, a P⁺-type sidewall polycrystalline silicon layer 106 and a sidewall silicon nitride layer 107 are formed on the sidewall of the polycrystalline silicon layer 103 and the silicon nitride layer 104 within the opening 105.

Figure 4C:
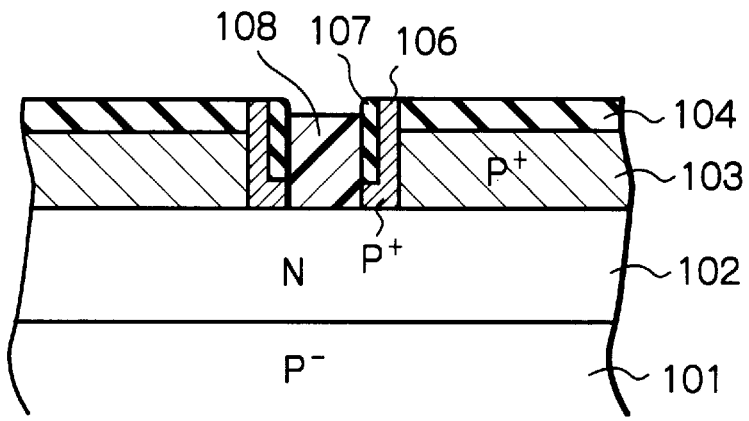

Next, referring to FIG. 4C, in the same way as in FIG. 1C, a photoresist pattern 108 is formed only within the opening 105.

Figure 4D:
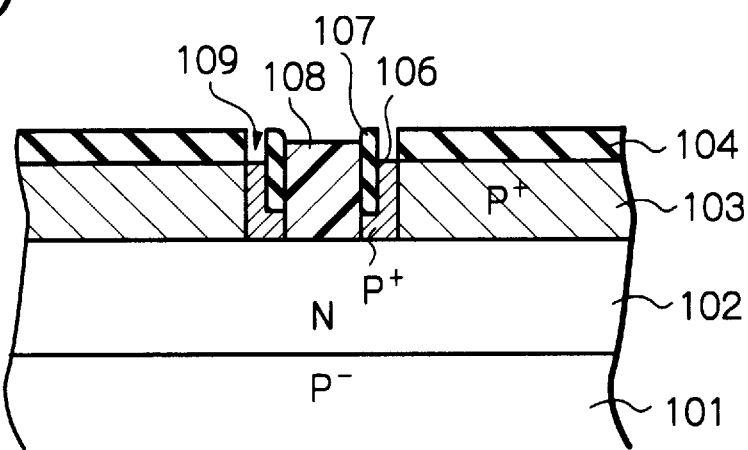

Next, referring to FIG. 4D, in the same way as in FIG. 1D, the sidewall polycrystalline silicon layer 106 is etched by using the photoresist pattern 108 and the silicon nitride layer 104 and 107 as a mask. As a result, an opening 109 is created between the silicon nitride layers 104 and 107. Then, the photoresist pattern 108 is removed.

Figure 4E:
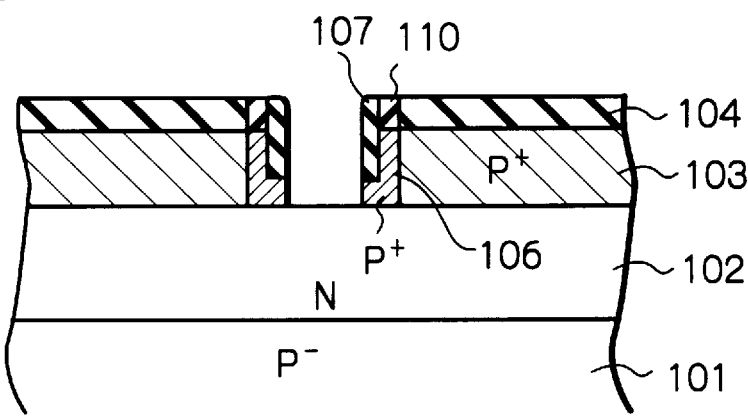

Next, referring to FIG. 4E, in the same way as in FIG. 1E, a silicon oxide layer 110 is deposited on the entire surface. Then, the silicon oxide layer is etched back, so that the silicon oxide layer 110 is left only within only the opening 109.

Figure 4F:
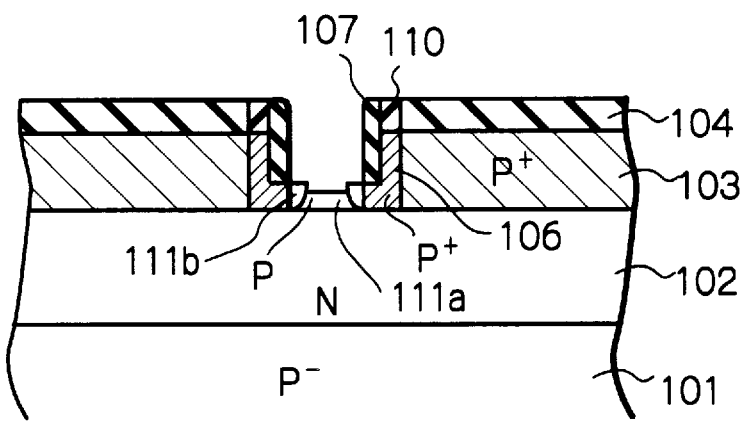

Next, referring to FIG. 4E, in a similar way to FIG. 1F, an epitaxial growth is carried out. As a result, a P-type moncrystalline silicon epitaxial base layer 111a' is formed on the collector layer 102. Simultaneously, a P-type polycrystalline silicon layer 111b' is formed on the sidewall of the polycrystalline silicon layer 106. Note that the epitaxial base layer 111a' of FIG. 4F is thinner than the epitaxial base layer 111a of FIG. 1F.

Figure 4G:
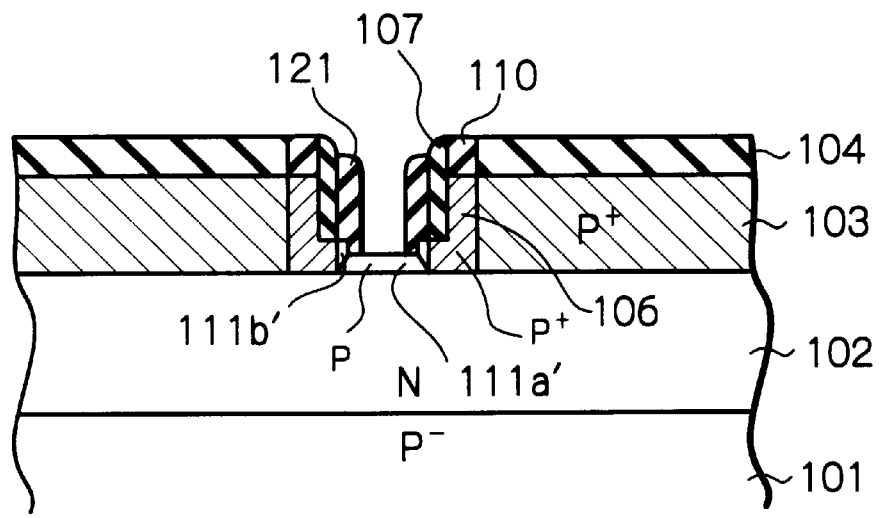

Next, referring to FIG. 4G, a BSG layer is deposited on the entire surface by a low pressure CVD process. Then, the BSG layer is etched back by an anisotropic dry etching process to form a sidewall BSG layer 121 on the sidewalls of the sidewall silicon nitride layer 107 and the polycrystalline silicon layer 111b'. In this case, the polycrystalline silicon layer 111b' is completely covered by the BSG layer 121. Note that surface levels are generated by the CVD process at the epitaxial base layer 111a'; however, such surface levels can be removed by an annealling operation.

Figure 4H:
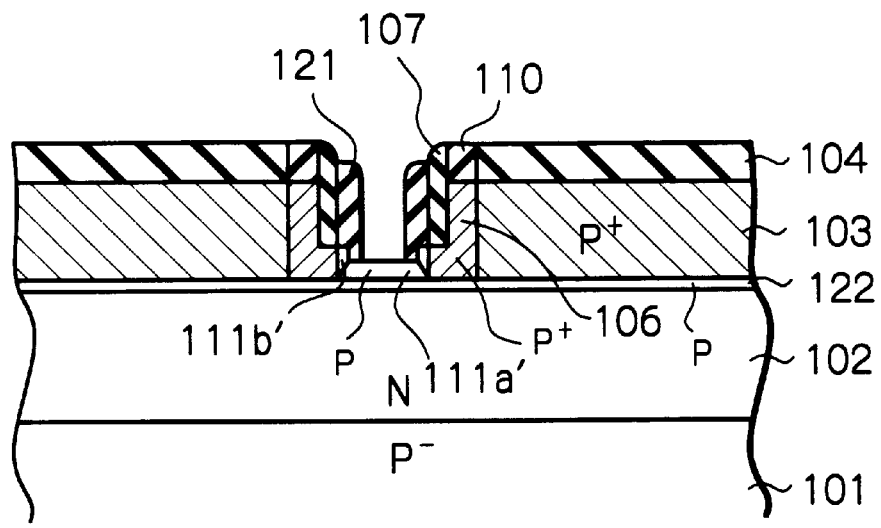

Next, referring to FIG. 4H, an annealling operation by the Ramp heating method at 1000° C. for 1 minute is carried out to remove the above-mentioned surface levels. Also, in this case, boron ions are diffused from the polycrystalline silicon layers 103 and 106 and the epitaxial base layer 111a' into the collector layer 102. As a result, a P-type impurity diffusion layer 122 is formed within the collector layer 102. Further, if the boron concentration of the BSG layer 121 is made high, about 5 to 10 mol %, borons ions are diffused from the sidewall BSG layer 121 into the polycrystalline silicon layer 111b' and the epitaxial base layer 111a', thus decreasing the resistance of the base link region (the periphery of the epitaxial layer 111a') and the base contact layer (111b'). Additionally, the crystal defects in the collector layer 102 caused by the anisotropic etching process for forming the sidewall polycrystalline silicon layer 106 and the sidewall silicon nitride layer 107 are removed by this annealing operation.

Figure 4I:
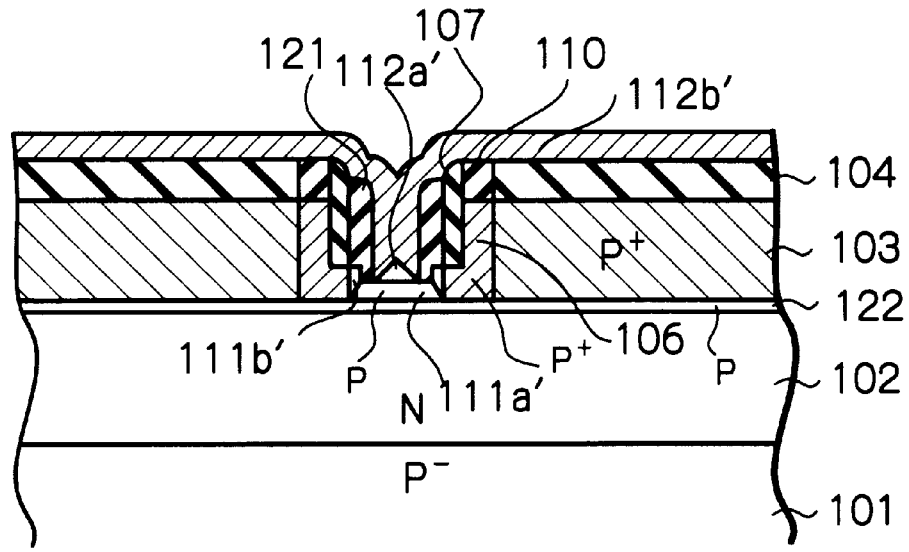

Next, referring to FIG. 4I, in the same way as in FIG. 1G, an epitaxial growth is carried out. As a result, an N-type monocrystalline silicon epitaxial emitter layer 112a' is formed on the epitaxial base layer 111a'. Simultaneously, an N-type polycrystalline silicon layer 112b' is formed on the silicon nitride layers 104 and 107, the silicon oxide layer 110 and the BSG layer 121.

Figure 4J:
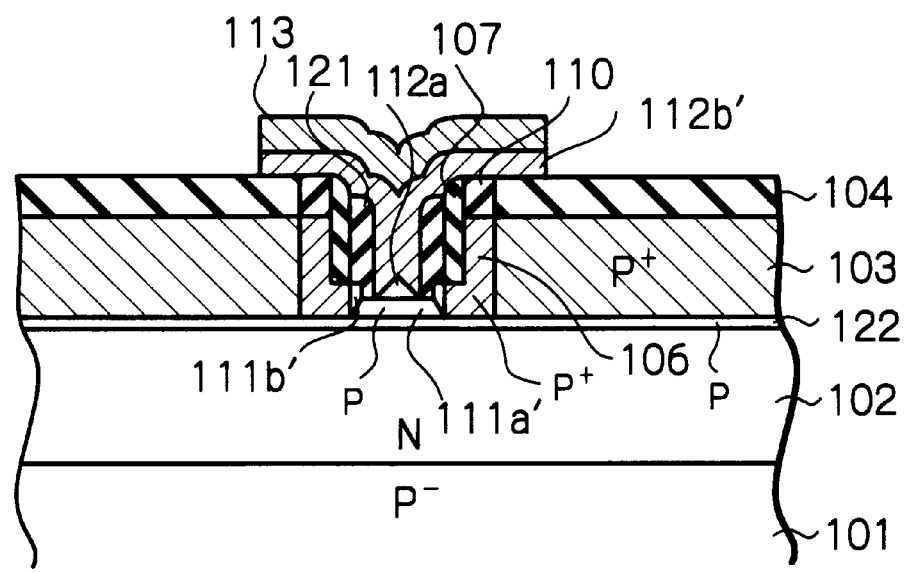

Finally, referring to FIG. 4J, in the same way as in FIG. 1H, a metal layer made of aluminum is deposited on the entire surface. Then, the metal layer is patterned to form an emitter electrode 113.

Note that the polycrystalline silicon layers 103 and 106 serve as a P⁺-type base contact layer which is connected to a base electrode (not shown). Also, the collector layer is connected to a collector electrode (not shown). The base electrode and the collector electrode are formed simultaneously with the formation of the emitter electrode 113.

In the first embodiment, assume that the epitaxial base layer 111a' has a boron concentration of $3 \times 10^{19}$ cm⁻³ and a thickness of 10 nm as indicated by B1 in FIG. 5, and the collector layer 102 has an arsenic concentration of $1 \times 10^{17} cm^{-3}$. In this case, if an annealing operation by the Ramp heating method at 1000° C. for 1 minute is carried out, the base region width is increased to 64 nm as indicated by B2 in FIG. 5.

Figure 6A:
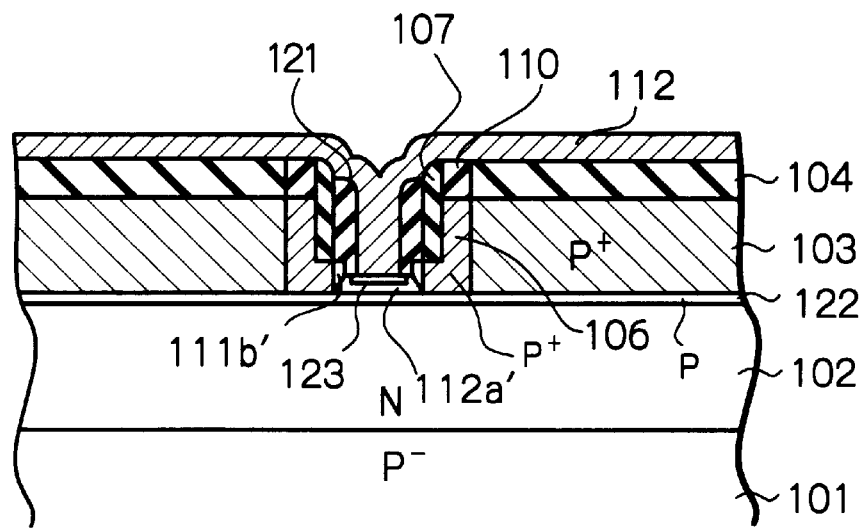
FIGS. 6A and 6B are cross-sectional views of modifications of FIGS. 4I and 4J, respectively.
Figure 6B:
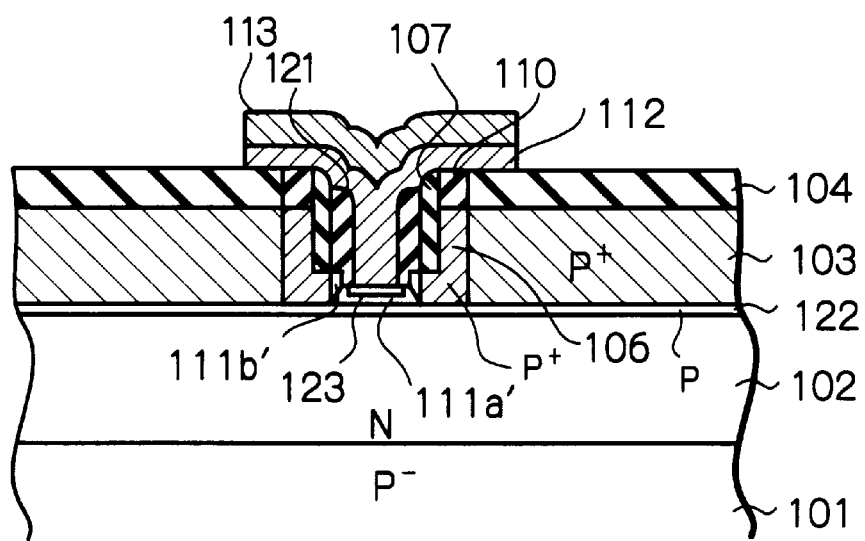

FIGS. 6A and 6B illustrate modifications of FIGS. 4I and 4J, respectively.

Referring to FIG. 6A, instead of the epitaxial growth of the epitaxial emitter layer 112a' and the polycrystalline silicon layer 112b', an N-type polycrystalline silicon layer 112 is deposited on the entire surface. Then, an annealing operation by the Ramp heating method at 1000° C. for 1 minute is carried out. As a result, an emitter region 123 is formed within the base epitaxial layer 112a'.

Next, referring to FIG. 6B, in the same way as in FIG. 4J, a metal layer made of aluminum is deposited on the entire surface. Then, the metal layer is patterned to form an emitter electrode 113.

In the modification of the first embodiment, if an annealing operation by the Ramp heating method at 1000° C. for 1 minute is further carried out after the formation of the polycrystalline silicon layer 112, the boron concentration is changed from B2 to B3 in FIG. 7. That is, since the boron concentration as indicated by B2 is already sufficiently graded, the diffusion of boron is small. On the other hand, assume that the arsenic concentration of the polycrystalline silicon layer 112 is $1 \times 10^{21}$, then, the emitter region width is increased by the annealling operation to 7 to 8 nm as indicated by A1 in FIG. 7.

Figure 3:
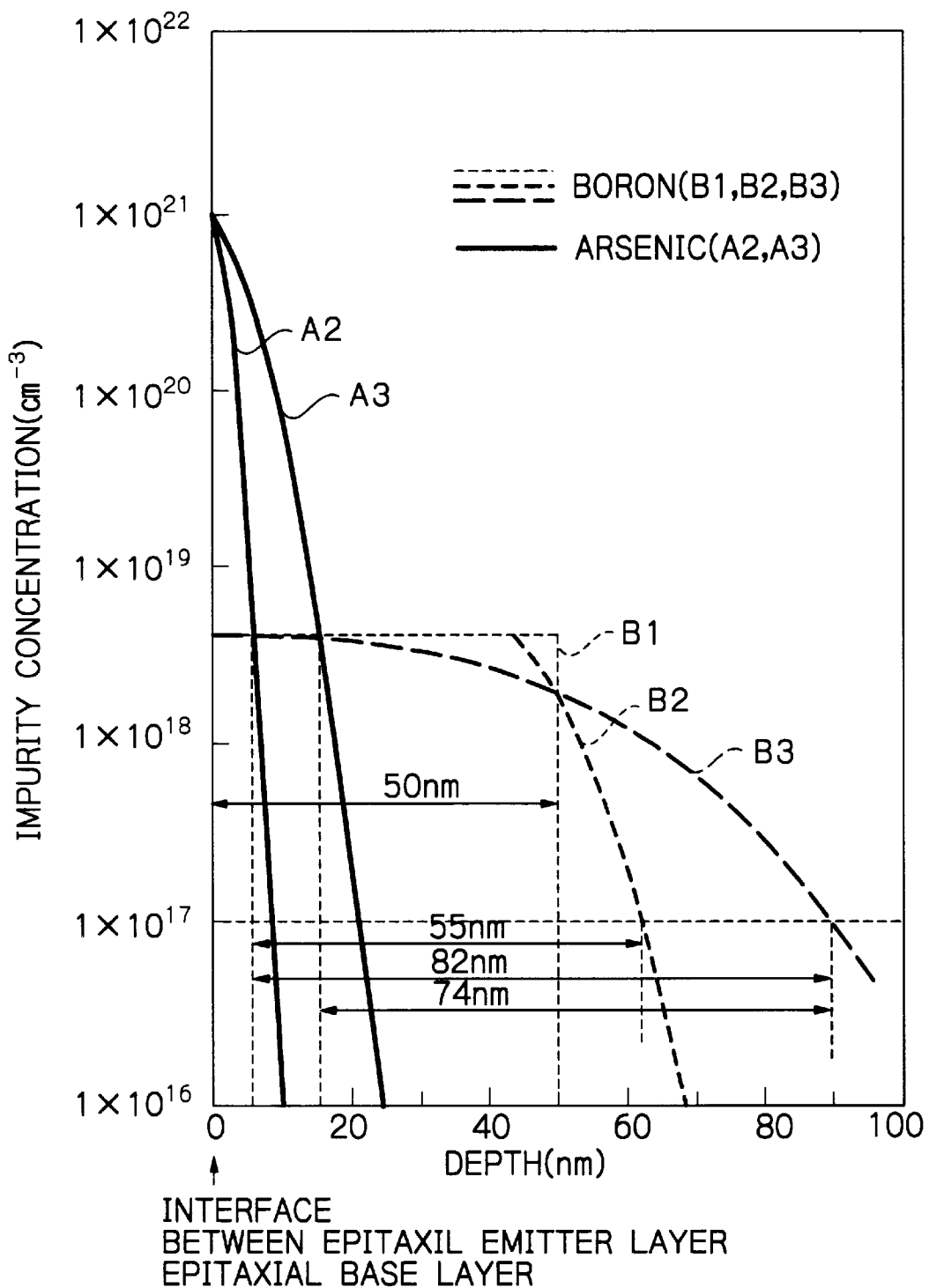
FIG. 3 is an impurity concentration diagram of the bipolar transistor manufactured by the methods as illustrated in FIGS. 1A through 1H and 2A through 2G.

Note that the base region width as indicated by B2 and B3 in FIGS. 5 and 7 is almost the same as the base region width as indicated by B1 and B2 in FIG. 3; however, in FIGS. 5 and 7, the slope of the boron concentration on the side of collector layer is so small that the base-collector parasitic capacitance can be reduced. This can improve the operation of the bipolar transistor.

Also, the impurity profile of an intrinsic base region is determined by the epitaxial base layer 111a' and the P-type impurity diffusion layer 122.

In the first embodiment as illustrated in FIGS. 4A through 4J and FIGS. 6A and 6B, since the P-type polycrystalline silicon layer 111b' is completely covered by the BSG layer 121 an emitter-base (PN) junction made of polycrystalline silicon is not formed. Therefore, the generation of the recombination current is suppressed.

In addition, crystal defects induced in the epitaxial base layer 111a' and the collector layer 102 can be removed by an annealling operation.

FIGS. 8A through 8I are cross-sectional views for explaining a second embodiment of the method for manufacturing a bipolar transistor.

Figure 8A:
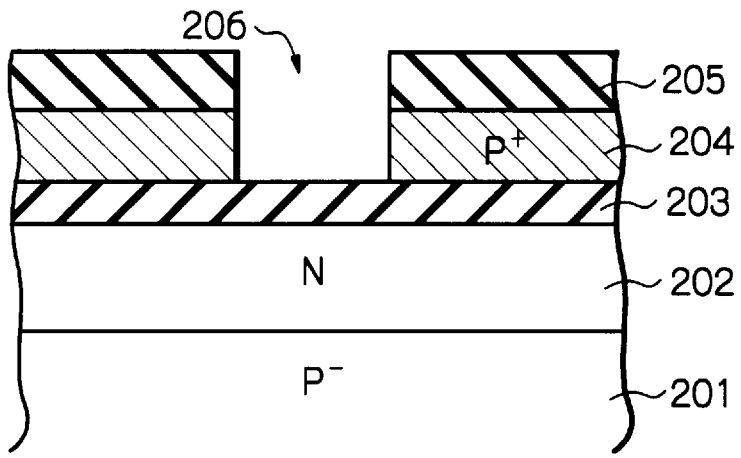
FIGS. 8A through 8I are cross-sectional views for explaining a second embodiment of the method for manufacturing a bipolar transistor according to the present invention.

First, referring to FIG. 8A, in the same way as in FIG. 2A, arsenic ions are implanted into a P⁻-type moncrystalline silicon substrate 201 to form an N-type collector layer 202. Then, an oxidation process is carried out to form a silicon oxide layer 203 on the collector layer 202. Then, a P⁻-type polycrystalline silicon layer 204 is deposited on the silicon oxide layer 203, and a silicon nitride layer 205 is deposited on the polycrystalline silicon layer 204. Then, an opening 206 is perforated in the silicon nitride layer 205 and the polycrystalline silicon layer 204.

Figure 8B:
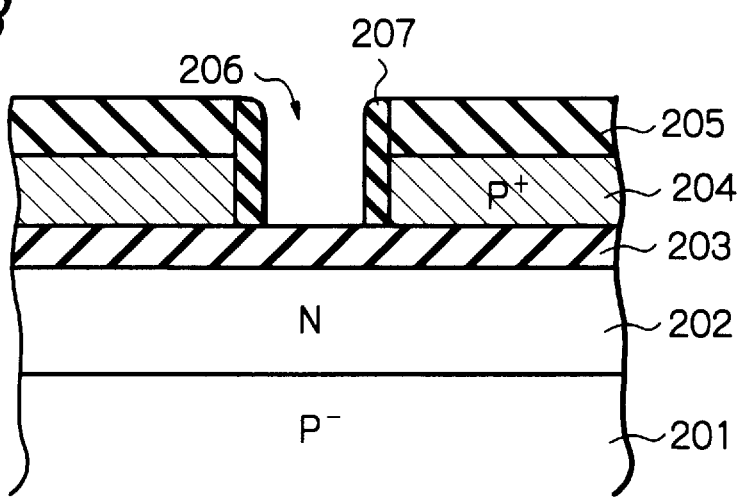

Next, referring to FIG. 8B, in the same way as in FIG. 2B, a silicon nitride layer is deposited on the entire surface. Then, the silicon nitride layer is etched back by an anisotropic etching process. As a result, a sidewall silicon nitride layer 207 is formed on the sidewall of the polycrystalline silicon layer 204 and the silicon nitride layer 205 within the opening 206.

Figure 8C:
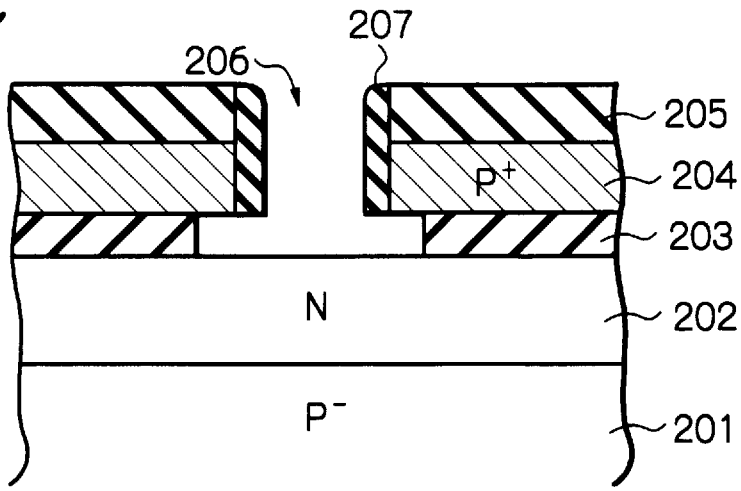

Next, referring to FIG. 8C, in the same way as in FIG. 2C, the silicon oxide layer 203 is etched by an isotropic etching process using the silicon nitride layers 205 and 207 as a mask. As a result, the bottom surface of the polycrystalline silicon layer 204 is exposed.

Figure 8D:
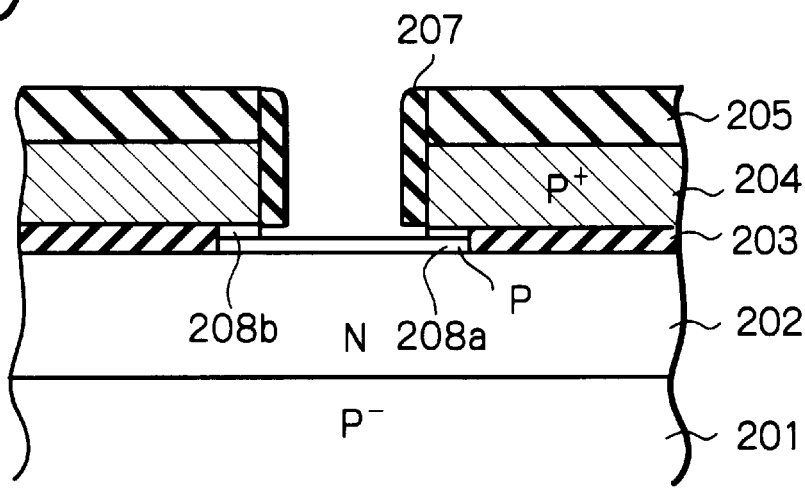

Next, referring to FIG. 8D, in the same way as in FIG. 2D, an epitaxial growth is carried out. As a result, a P-type moncrystalline silicon epitaxial base layer 208a is formed on the collector layer 202. Simultaneously, a P-type polycrystalline silicon layer 208b is formed under the polycrystalline silicon layer 204.

Note that, since the collector layer 202 was protected by the silicon oxide layer 203, crystal defects are hardly caused by the anisotropic etching processes in the collector layer 202. Therefore, crystal defects are hardly created in the epitaxial base layer 208a grown from the collector layer 202.

Figure 8E:
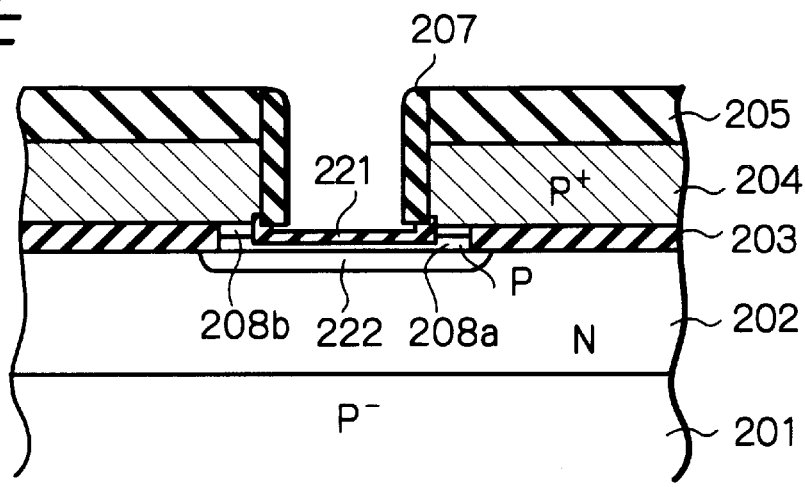

Next, referring to FIG. 8E, an annealling operation is carried out in an oxygen atmosphere. As a result, the epitaxial base layer 208a and the polycrystalline silicon layer 208b are oxidized, so that a silicon oxide layer 221 is grown. In this case, surface levels are hardly generated in the epitaxial base layer 208a due to the thermal oxidation process. Simultaneously, boron ions are diffused from the polycrystalline silicon layer 204 into the polycrystalline silicon layer 208b; boron ions are diffused from the polycrystalline silicon layer 208b into the epitaxial base layer 208a; and boron ions are diffused from the epitaxial base layer 208a into the collector layer 202. As a result, a P-type impurity diffusion layer 222 is formed within the collector layer 202.

Note that an intrinsic base region is determined by the epitaxial base layer 208a and the P-type impurity layer 222.

Figure 8F:
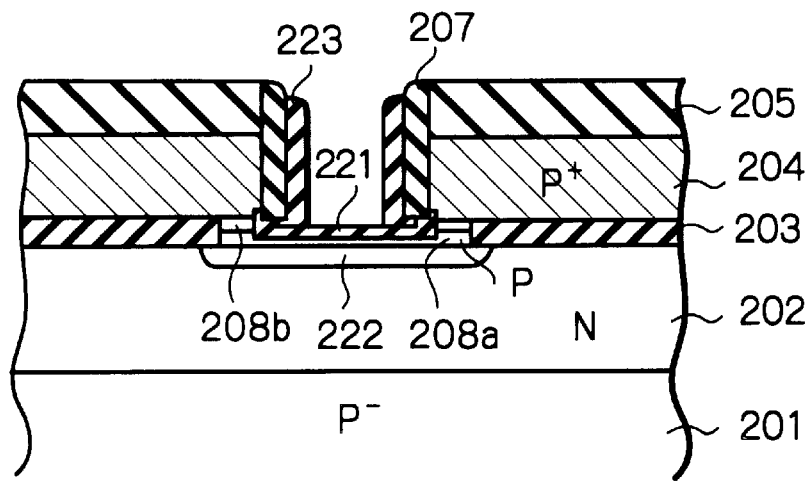

Next, referring to FIG. 8F, a silicon nitride layer is deposited on the entire surface by a low pressure CVD process. Then, the silicon nitride layer is etched by an anisotropic etching process. As a result, a sidewall silicon nitride layer 223 is formed on the sidewall of the sidewall silicon nitride layer 207. Note that the epitaxial base layer 208a is hardly damaged by this anisotropic etching process, since the epitaxial base layer 208a is covered by the silicon oxide layer 221. For this purpose, the silicon oxide layer 221 is preferably 30 nm thick or more.

Figure 8G:
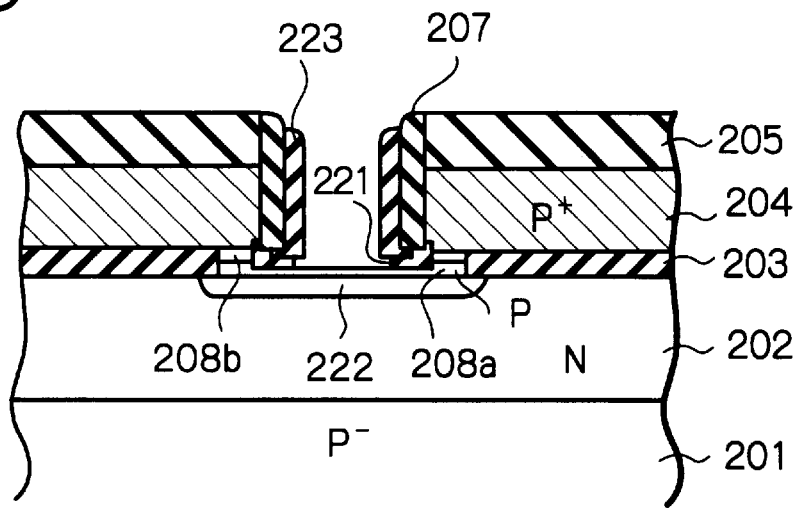

Next, referring to FIG. 8G, a part of the silicon oxide layer 221 is etched by a wet etching process.

Figure 8H:
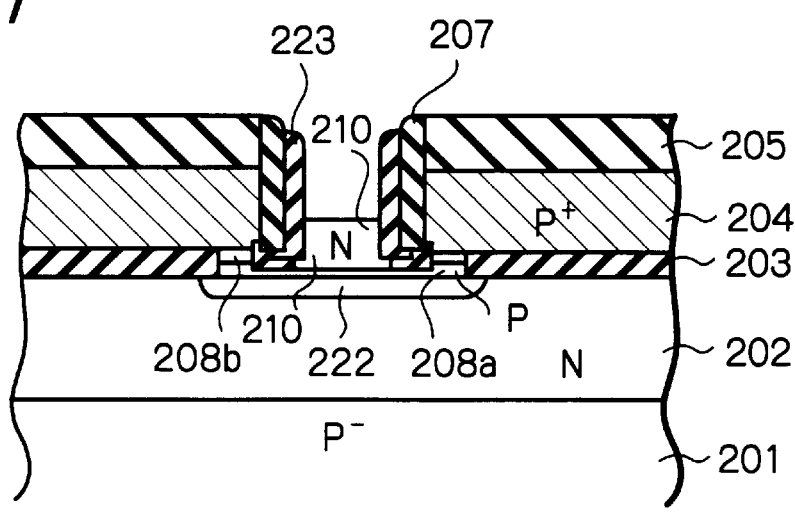

Next, referring to FIG. 8H, in the same way as in FIG. 2F, an epitaxial growth is carried out. As a result, an N-type moncrystalline silicon epitaxial emitter layer 210 is formed on the epitaxial base layer 208a.

Figure 8I:
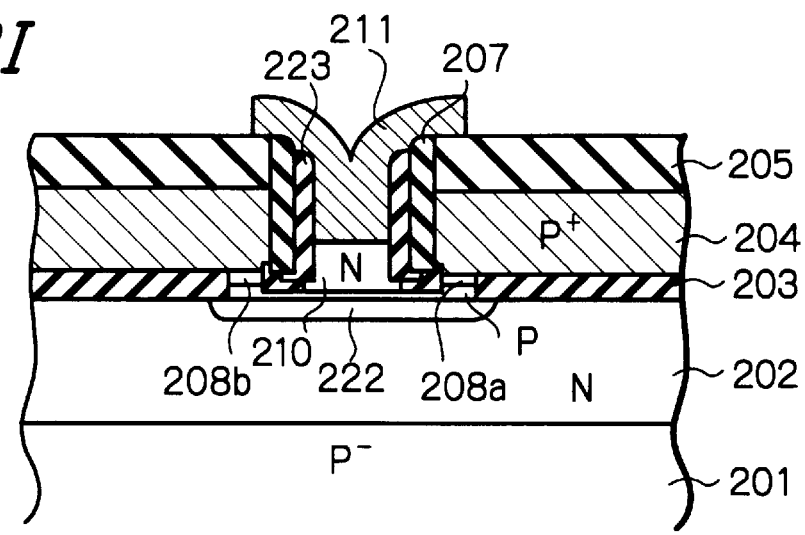

Finally, referring to FIG. 8I, in the same way as in FIG. 2G, a metal layer made of aluminum is deposited on the entire surface. Then, the metal layer is patterned to form an emitter electrode 211.

Note that the polycrystalline silicon layers 204 and 208b serve as a P⁺-type base contact layer which is connected to a base electrode (not shown). Also, the collector layer is connected to a collector electrode (not shown). The base electrode and the collector electrode are formed simultaneously with the formation of the emitter electrode 211.

In the second embodiment, since the surface of the epitaxial base layer 208a is hardly damaged by the anisotropic etching process for forming the sidewall silicon nitride layer 223, due to the presence of the silicon oxide layer 221, crystal defects are hardly created in the epitaxial base layer 208a.

Figure 9:
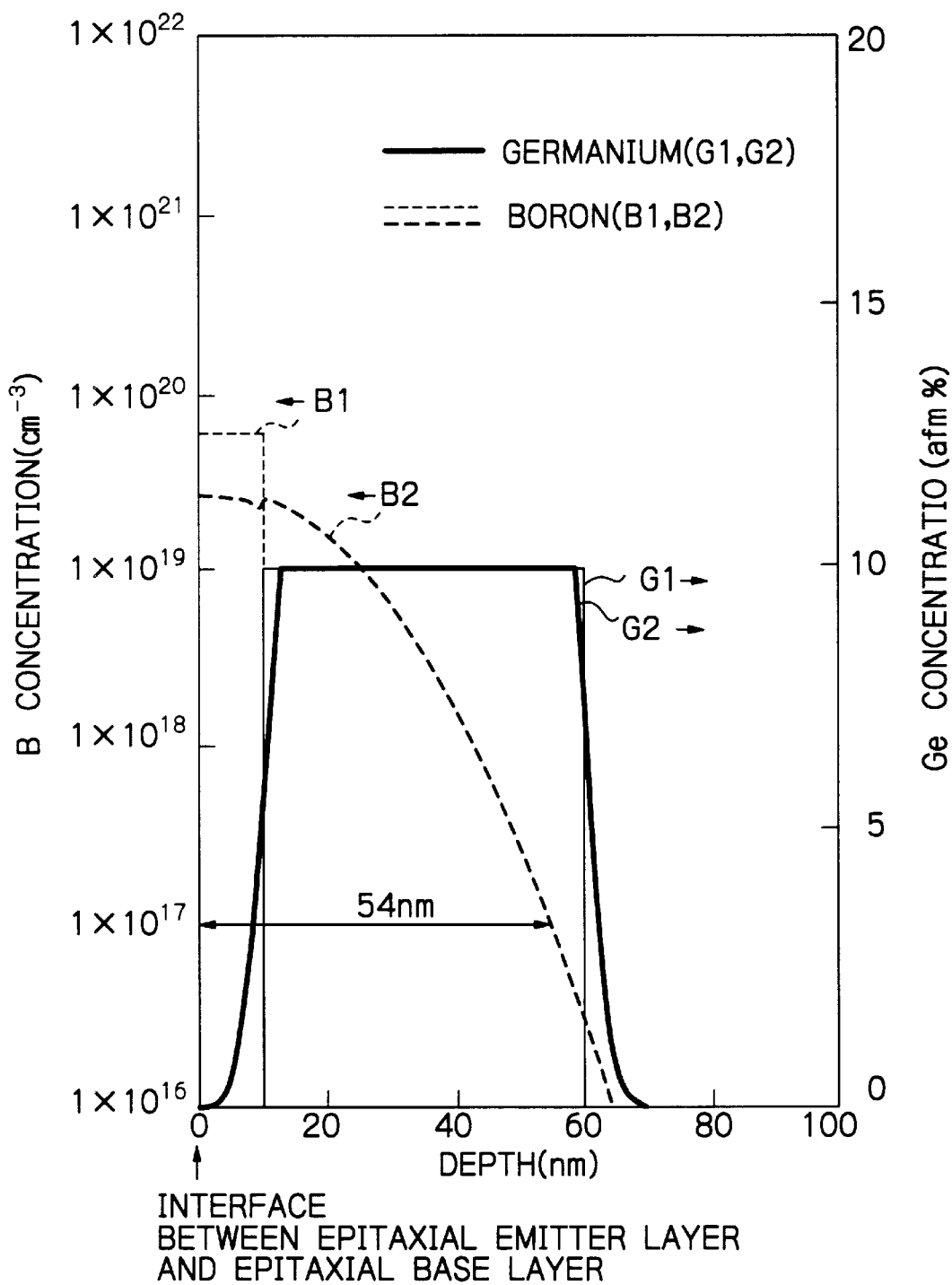
FIG. 9 is an impurity concentration diagram of the bipolar transistor manufactured by the method as illustrated in FIGS. 8A through 8I.

In the above-mentioned first embodiment, the epitaxial base layer 111a' as illustrated in FIG. 4F can be made of an about 50 nm thick epitaxial Si—Ge layer having a Ge concentration of 10 mol % as indicated by G1 in FIG. 9 and an about 10 nm thick epitaxial Si layer having a boron concentration of $6 \times 10^{19}$ cm$^{-3}$ as indicated by B1 in FIG. 9. In this case, when an annealing operation by the Ramp heating method at 900° C. for about 30 minutes is carried out at a step as shown in FIG. 4H, boron ions are diffused from the epitaxial Si layer into the epitaxial Si—Ge layer as indicated by B2 in FIG. 9. Simultaneously, germanium is diffused from the epitaxial Si—Ge layer into the epitaxial Si layer and the collector layer 102 as indicated by G2 in FIG. 9. In addition, N-type impurity ions are diffused from the collector layer 102 into the epitaxial Si—Ge layer. Assume that the N-type impurity concentration of the collector layer 102 is about $1 \times 10^{17}$ cm$^{-3}$. Then, the base region width is 54 nm. Thus, the base-collector junction is located within the epitaxial Si—Ge layer after the annealling operation. Thus, a heterostructured bipolar transistor (HBT) can be obtained.

In the annealling operation for the HBT, when the temperature is lower, the generation of crystal defects due to the lattice strain between the epitaxial Si—Ge layer and the collector layer can be suppressed, and also, the diffusion of germanium can be suppressed so that the location of the base-collector junction can be precisely determined.

In the above-described HBT, high speed characteristics and high current gain characteristics can be obtained in the same way as in the first embodiment. Also, since a base region is formed by a narrow bandgap Si—Ge layer, the injection of holes from the P-type base region into an N-type emitter is suppressed. As a result, even if the impurity concentration of the base region is increased, the reduction of a current gain can be suppressed, thus improving the reduction of the base resistance and the breakdown voltage between the emitter and collector.

In the above-described embodiments, the epitaxial base layer is 10 nm thick; however, the thickness of the epitaxial base layer is preferably from 5 nm to 30 nm. Also, the annealing operation is carried out at 1000° C.; however, the temperature of the annealing operation is preferably from 800° C. to 1050° C. Further, the base region width is preferably twice as large as the width of the epitaxial base layer.

As explained hereinabove, according to the present invention, since impurities of an epitaxial base layer are a diffusion source for a base region, a stable impurity dose of the base region can be obtained by programming an epitaxial growth, i.e., the impurtiy concentration and thickness of the epitaxial base layer. In addition, the surface levels and crystal defects generated in the collector layer and the epitaxial base layer can be removed by carrying out an annealling operation, thus suppressing the generation of recombination currents. Further, a stable base impurity profile can be obtained by adjusting the condition of the annealling operation based upon the impurity concentration of an epitaxial base layer.

What is claimed is:

1. A method for manufacturing a bipolar transistor, comprising the steps of:
    forming a semiconductor layer having a collector region of a first conductivity type;
    growing an epitaxial semiconductor layer of a second conductivity type opposite to said first conductivity type on said semiconductor layer; and
    thermally diffusing impurities from said epitaxial semiconductor layer into said semiconductor layer, so that a base region is formed by said epitaxial semiconductor layer and a part of said semiconductor layer.

2. The method as set forth in claim 1, wherein a width of the part of said semiconductor layer is larger than a width of said epitaxial semiconductor layer.

3. The method as set forth in claim 1, wherein a thickness of said epitaxial semiconductor layer is approximately from 5 nm to 30 nm.

4. The method as set forth in claim 1, wherein said thermally diffusing step is carried out at approximately 800° C. to 1050° C.

5. A method for manufacturing a bipolar transistor, comprising the steps of:
    forming a semiconductor layer having a collector region of a first conductivity type;
    growing an epitaxial semiconductor layer having an impurity including layer including impurities of a second conductivity type opposite to said first conductivity type on said semiconductor layer; and
    thermally diffusing said impurities from said impurity including layer into said epitaxial semiconductor layer and said semiconductor layer, so that a base region is formed by said impurity including layer and a part of said epitaxial semiconductor layer except for said impurity including layer.

6. The method as set forth in claim 5, wherein a width of the part of said epitaxial semiconductor layer is larger than a width of said impurity including layer.

7. The method as set forth in claim 5, wherein a thickness of said impurity including semiconductor layer is approximately from 5 nm to 30 nm.

8. The method as set forth in claim 5, wherein said thermally diffusing step is carried out at approximately 800° C. to 1050° C.

9. A method for manufacturing a bipolar transistor, comprising the steps of:
    growing a monocrystalline silicon collector layer of a first conductivity type on a monocrystalline semiconductor substrate;
    forming a first polycrystalline semiconductor layer of a second conductivity type opposite to said first conductivity on said collector layer;
    forming a first insulating layer on said first polycrystalline semiconductor layer;
    perforating an opening in said first insulating layer and said first polycrystalline semiconductor layer;
    forming a second polycrystalline semiconductor layer of said second conductivity type on said first insulating layer and said collector layer after said opening is perforated;
    forming a second insulating layer on said second semiconductor layer;
    etching back said second insulating layer and said second polycrystalline silicon layer, so that a sidewall layer of said second polycrystalline semiconductor layer and said second insulating layer is formed on a sidewall of said first insulating layer and said first polycrystalline semiconductor layer;
    burying a photoresist layer in an opening surrounded by said sidewall layer;
    etching a part of said second polycrystalline semiconductor layer by using said photoresist layer and said first and second insulating layers as a mask;
    removing said photoresist layer after the part of said second polycrystalline semiconductor layer is etched;
    burying a third insulating layer in an opening surrounded by said first and second insulating layers after said photoresist layer is removed;

growing an epitaxial base layer of said second conductivity layer on said collector layer and a third polycrystalline semiconductor layer of said second conductivity type on a sidewall of said second polycrystalline semiconductor layer after said third insulating layer is buried;

forming a fourth insulating layer on a sidewall of said second insulating layer and a sidewall of said third polycrystalline semiconductor layer; and thermally diffusing impurities from said first, second and third polycrystalline semiconductor layers and said epitaxial base layer into said collector layer, to form an impurity diffusion region of said second conductivity type within said collector layer, a base region being formed by said epitaxial base layer and said impurity diffusion region.

10. The method as set forth in claim 9, further comprising a step of growing an epitaxial emitter layer of said first conductivity type on said epitaxial base layer and a fourth polycrystalline silicon layer on a sidewall of said fourth insulating layer, after said impurity diffusion region is formed.

11. The method as set forth in claim 9, further comprising the steps of;

forming a fourth polycrystalline semiconductor layer of said first conductivity type on said epitaxial base layer after said impurity diffusion region is formed; and thermally diffusing impurities from said fourth polycrystalline semiconductor layer into said epitaxial base layer, to form an emitter region of said first conductivity type within said epitaxial base layer.

12. A method for manufacturing a bipolar transistor, comprising the steps of:

growing a monocrystalline silicon collector layer of a first conductivity type on a monocrystalline semiconductor substrate;

forming a first semiconductor oxide layer on said collector layer;

forming a first polycrystalline semiconductor layer of a second conductivity type opposite to said first conductivity type on said first semiconductor oxide layer;

forming a first silicon nitride layer on said first polycrystalline semiconductor layer;

perforating an opening in said first silicon nitride layer and said first polycrystalline semiconductor layer by using said first semiconductor oxide layer as an etching stopper;

forming a second silicon nitride layer on said second semiconductor layer;

etching back said second polycrystalline silicon layer, so that a sidewall layer of said second insulating layer is formed on a sidewall of said first insulating layer and said first polycrystalline semiconductor layer;

etching said first silicon oxide layer so that said collector layer and a part of a bottom of said first polycrystalline semiconductor layer are exposed, after said opening is perforated;

growing an epitaxial base layer of said second conductivity layer on said collector layer and a second polycrystalline semiconductor layer of said second conductivity type on the part of the bottom of said first polycrystalline semiconductor layer after said first silicon oxide layer is etched;

carrying out an oxidization operation to diffuse impurities from said first and second polycrystalline semiconductor layers and said epitaxial base layer into said collector layer, to form an impurity diffusion region of said second conductivity type within said collector layer, and simultaneously to form a second semiconductor oxide layer on said epitaxial base layer;

forming a third silicon nitride layer on a sidewall of said second insulating layer after said oxidation operation is carried out;

etching said second semiconductor oxide layer by using said third silicon nitride layer as a mask; and growing an epitaxial emitter layer of said first conductivity type on said epitaxial base layer and a third polycrystalline silicon layer on a sidewall of said third insulating layer, after said second semiconductor oxide layer is etched.

* * * * *